United States Patent [19]

Ramseyer et al.

[11] Patent Number: 5,754,556
[45] Date of Patent: May 19, 1998

[54] SEMICONDUCTOR MEMORY TESTER WITH HARDWARE ACCELERATORS

[75] Inventors: Steve G. Ramseyer; Steven A. Michaelson, both of Moorpark; Michael H. Augarten, Newbury Park, all of Calif.

[73] Assignee: Teradyne, Inc., Boston, Mass.

[21] Appl. No.: 683,397

[22] Filed: Jul. 18, 1996

[51] Int. Cl.$^6$ .................................................. G01R 31/28
[52] U.S. Cl. ................................... 371/10.3; 395/183.01
[58] Field of Search .................................... 371/10.3, 21.1, 371/6, 21.6, 40.1, 40.4, 10.2, 25.1, 22.6, 41, 68.1; 324/765; 395/185.01, 182.01, 182.04, 183.01, 183.13; 365/201; 364/551.01

[56] References Cited

U.S. PATENT DOCUMENTS

| Re. 32,388 | 3/1987 | Lockhart, Jr. et al. | 324/158 |
|---|---|---|---|
| 4,309,657 | 1/1982 | Lockhart, Jr. et al. | 110/707 |
| 4,389,715 | 6/1983 | Eaton, Jr. et al. | 365/200 |
| 4,414,665 | 11/1983 | Kimura et al. | 371/21 |
| 4,450,560 | 5/1984 | Conner | 371/25 |
| 4,628,509 | 12/1986 | Kawaguchi | 371/21 |
| 4,665,501 | 5/1987 | Saldin et al. | 364/900 |
| 4,736,373 | 4/1988 | Schmidt | 371/10 |
| 4,752,929 | 6/1988 | Kantz et al. | 371/21 |
| 4,876,685 | 10/1989 | Rich | 371/21.6 |
| 5,123,016 | 6/1992 | Muller et al. | 371/10.3 |
| 5,132,937 | 7/1992 | Tuda et al. | 365/201 |
| 5,138,619 | 8/1992 | Fasang et al. | 371/21.1 |
| 5,157,664 | 10/1992 | Waite | 371/10.2 |
| 5,247,481 | 9/1993 | Conan | 365/200 |
| 5,276,863 | 1/1994 | Heider | 395/575 |
| 5,280,486 | 1/1994 | Arkin et al. | 371/29.1 |
| 5,299,202 | 3/1994 | Vaillancourt | 371/11.1 |
| 5,317,573 | 5/1994 | Bula et al. | 371/10.3 |
| 5,317,752 | 5/1994 | Jewett et al. | 395/750 |
| 5,337,318 | 8/1994 | Tsukakoshi et al. | 371/5.5 |
| 5,363,382 | 11/1994 | Tsukakoshi | 371/21.2 |
| 5,577,050 | 11/1996 | Bair et al. | 371/10.2 |

OTHER PUBLICATIONS

Citation A, *Memory Evaluation Apparatus*, Japanese Patent Public Disclosure No. 6498/1987, Katsuhiko Sato, 13 Jan. 1987, pp. 1–2 (English) pp. 617–620 (Japanese).

Citation B, Method and Apparatus for Analyzing Memory Failure, Japanese Patent Public Disclosure No. 11999/1986, Shigeyuki Murakami, 20, Jan. 1986, pp. 1–2 (English), pp. 713–723 (Japanese).

*Primary Examiner*—Robert W. Beausoliel, Jr.
*Assistant Examiner*—Nadeem Iqbal
*Attorney, Agent, or Firm*—Edmund J. Walsh

[57] ABSTRACT

A semiconductor memory manufacturing system including a tester sub-system and a redundancy analysis sub-system. The manufacturing system includes a transfer circuit between the test sub-system and the redundancy analysis sub-system that reduces the number of bits of data transferred to the redundancy analyzer. This speeds up the transfer process and also speeds up the redundancy analysis.

20 Claims, 4 Drawing Sheets

SEMICONDUCTOR MEMORY TESTER WITH HARDWARE ACCELERATORS

This invention relates generally to testing semiconductor components and more specifically to testing and repairing semiconductor memory chips during their manufacture.

Modern computers use semiconductor memory chips. As computer processors have gotten more powerful, the amount of memory needed in a computer has increased. As a result, the number of bits of information that can be stored in one memory chip has increased.

As more memory has been used, market demands have forced memory manufacturers to reduce the price of memory. Historically, the price per bit of storage has decreased significantly. Increasing size and decreasing price have combined to make a very difficult challenge for manufacturers of semiconductor memories. Namely, they must reduce their cost of making memories.

One difficulty in reducing the cost of making larger memories is that the chance of a defective semiconductor memory increases as the size of the memory increases. Thus, lower yields are to be expected as memory size increases. Yield is, however, a very significant factor affecting the production cost of a semiconductor circuit.

To boost yields, memory manufacturers include redundant cells as part of each semiconductor memory. Defective cells are replaced by the redundant cells to make a completely functioning memory. Provided the repair can be performed quickly, production costs can be reduced by repairing defective dies.

The repair is typically made as part of the wafer level test. Each die on a wafer is tested with a high speed memory tester, such as the J995 sold by Teradyne, Inc. of Aguora Hills, Calif., USA. The tester identifies dies with faulty memory cells and makes a record of which cells are faulty. The fault information is stored in a capture RAM as the test is run.

After a test, the contents of the capture RAM are transferred to one or more redundancy analyzers. In some systems, just the address of each failed location is transferred to the redundancy analyzer. Transferring just the address of the failure can reduce the total amount of information stored in the analyzer.

Lossy data compression has also been done by grouping rows and columns. For example, clusters of adjacent cells have sometimes been grouped together. If one or more of those cells is faulty, a data value indicates that the group is faulty. Even if several cells in the group is faulty, only one piece of information is transmitted to the redundancy analyzer. However, because the compression is lossy, it is not possible to determine, based on the information provided to the redundancy analyzer, which individual memory locations are faulty. Therefore, all of the cells within a group must be replaced.

Each analyzer contains a separate memory and a processor. The processor computes which memory cells should be replaced by redundant cells to repair the defective memories. U.S. patent application Ser. No. 08/011,003 entitled "Redundancy Analyzer For Automatic Memory Tester" by M. Augarten (which is hereby incorporated by reference) discloses such a memory tester. Various techniques are used by the redundancy analyzer to determine which rows or columns to replace.

The catch RAM is generally made of SRAM because it can operate very fast. Likewise, the memory in the analyzer is usually made of SRAM to achieve high speed. However, SRAM is expensive, which can be a significant problem if the analyzer must be able to hold information about a very large memory under test.

The information about which rows or columns should be replaced is passed on to a repair station, typically as an electronic data file. The repair station makes the required connections on the die, typically using a laser to permanently alter the die.

The cells in the memory are arranged in rows and columns. The redundant cells are also arranged in rows and columns. Repairs are made by replacing either the entire row or the entire column containing a defective cell.

There are only a limited number of redundant rows and columns, which limits the number of defective cells that can be repaired. If there are more defective cells than can be repaired, the entire die is typically discarded.

Very often, defective cells occur in clusters. Thus, it is often possible to repair several defective cells by replacing a single row or a single column. By appropriate usage of the redundant rows and columns, even memories with many defects can be repaired using a few redundant rows and columns. To get the best usage of the redundant rows and columns, many memory testers are programmed to try different ways to use the redundant rows and columns until they find one that repairs all defective cells. This technique is called a "exhaustive tree type" technique. If there is any solution that allows all defective cells to be replaced, this technique will eventually find it. The technique is, however, relatively slow. For large memories, this technique is likely to be too slow, particularly for sue in the mass production of semiconductor memories.

An alternative method for determining how to allocate the redundant rows and columns to repair specific defects is called the "Most repair algorithm." With this technique, the tester identifies the row or column with the highest number of defective memory cells. One redundant element is used to repair that row or column. The row or column with the next highest number of defective cells is then repaired. The process is repeated until all the redundant elements are used. This method often works and is much faster than a exhaustive tree type technique. However, there are some patterns of defective cells which could be repaired that will not be repaired by allocating redundant elements in this fashion.

One technique for increasing the speed at which memory repairs can be made is called the "Must repair algorithm" technique. The Must repair algorithm takes advantage of the fact that any row which contains more faulty cells than there are redundant columns must be repaired, if at all, with a redundant row. Likewise, any columns which contains more faulty cells than there are redundant rows must be repaired, if at all, with a redundant column. Therefore, the Must repair algorithm is widely used as a preprocessing step to accurately allocate redundant elements to those faulty cells which must be repaired with those redundant elements.

Even with existing speed improvement techniques, it would be highly desirable to further reduce the time required to repair a memory during the manufacturing operation. Semiconductor processing facilities are very expensive and it is important that each facility manufacture as many functioning memory chips as possible in order to operate economically.

SUMMARY OF THE INVENTION

With the foregoing background in mind, it is an object of the invention to provide a fast way to analyze data from the test of semiconductor memory chips.

It is also an object to allow the use of inexpensive, slow memories in the analyzer.

The foregoing and other objects are achieved by reducing the amount of information stored in the analyzer memory. In one embodiment, reduction is achieved by suppressing storage of failures in a row or column in excess of the number which will trigger the Must repair algorithm replacement. In another embodiment, reduction is achieved by storing information about a failed cell and the cells around it in a compressed format.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
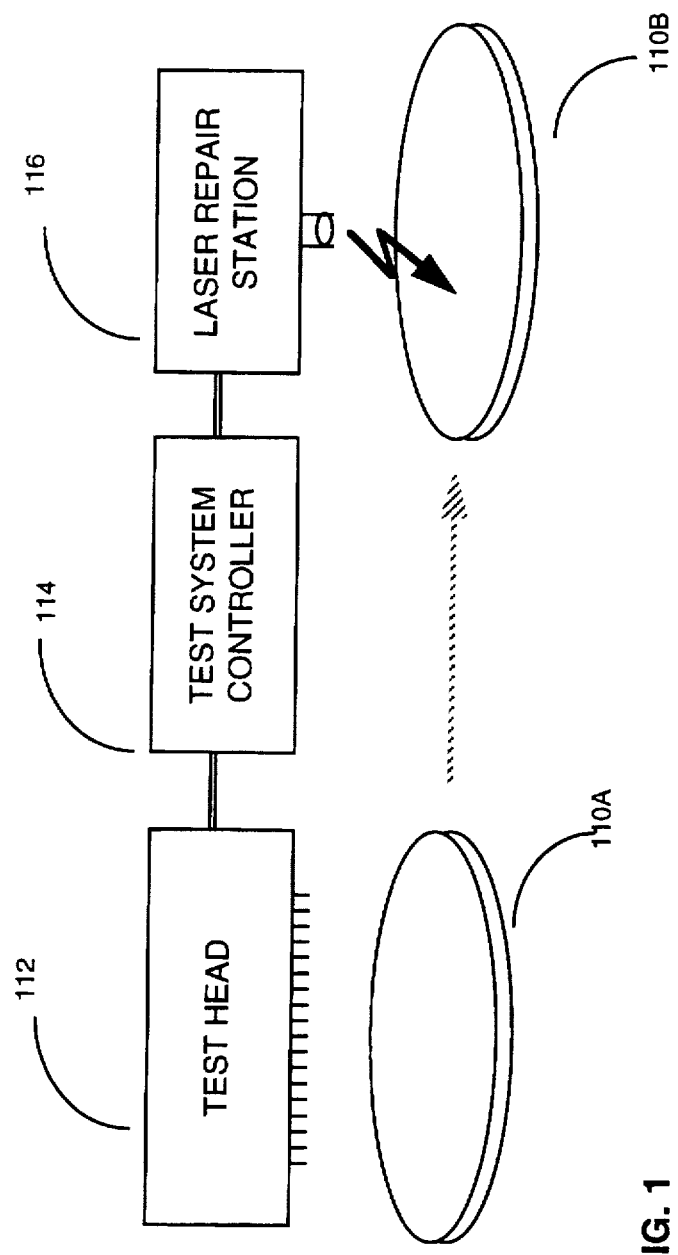
FIG. 1 is a block diagram of the repair portion of a prior art memory manufacturing operation.

FIG. 1 shows the memory repair portion of a semiconductor manufacturing operation. A test head 112 has numerous probes (not numbered) that make contact with a wafer 110A containing a semiconductor memory under test. Test head 112 generates and measures the signals which determine which memory cells are faulty.

Test head 112 contains a capture RAM (not shown) that stores this information as the test is being performed. The capture RAM is generally high speed memory, such as SRAM, so that the test can be run very quickly.

Following the test, the failure information stored in the capture RAM is transferred to one or more analysis circuits (not shown) within the test system controller 114. The analysis circuits determine which rows and columns in the memory under test are to be replaced with redundant elements.

In a preferred embodiment, there is an analysis circuit for each region of the memory under test. Each region of the memory has its own redundant rows and columns, enabling the required repairs for each region to be computed separately. However, the number of analysis circuits is not important for the invention.

In a preferred embodiment, the analysis circuits operate in parallel in a "back ground mode." The analysis circuits operate on data collected for one memory under test while another memory is being tester. All the analysis circuits operate simultaneously, each analyzing one region of the memory under test. In this way, the total throughput of the memory manufacturing system can be maximized.

The information derived by the analysis circuits is then passed to laser repair station 116. Simultaneously, the wafer containing the memory under test is moved to position 110B at the laser repair station 116. Laser repair station 116 uses a laser beam to alter the memory under test to electrically disconnect the faulty rows and columns and replace them with redundant elements. In most cases, the redundant rows and columns, if used correctly, fully repair the memory under test.

Figure 2:
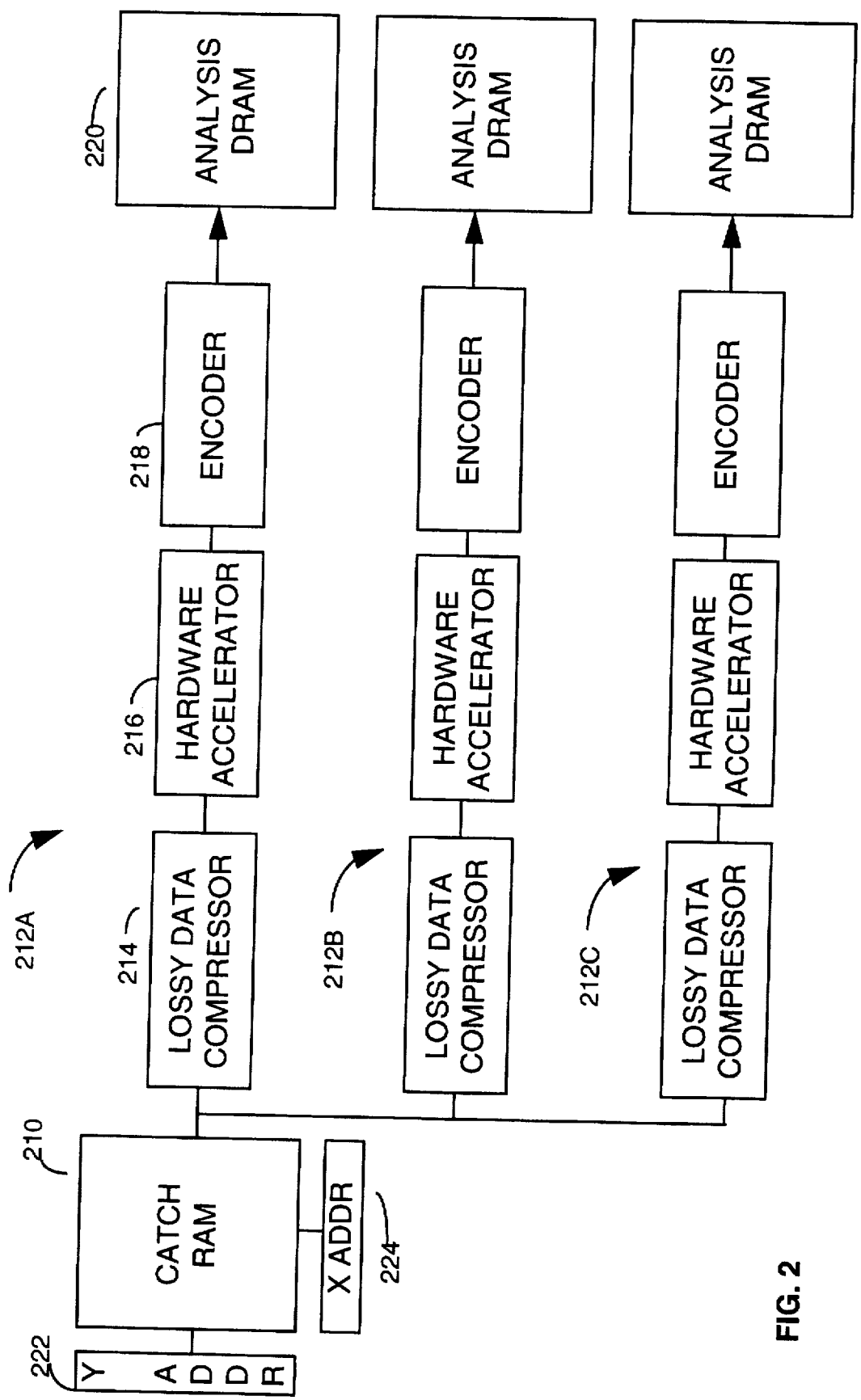
FIG. 2 is a block diagram of the transfer path between a catch RAM and analyzer memory according to the invention.

Turning to FIG. 2, additional details of the data paths between catch RAM 210 and analysis RAMs 220 within the analysis circuits are shown. Data from catch RAM 210 is passed to lossy data compressor 214. FIG. 2 shows multiple paths 212A, 212B and 212C. In a preferred embodiment, there will be multiple analysis circuits, with one path for each analysis circuit.

Lossy data compressor 214 combines groups of adjacent memory cells into one value as in the prior art. Lossy data compressor 214 is used when testing memories configured with redundant rows or columns that any can be replaced in groups. For example, in the manufacture of a memory that contains redundant rows and columns in groups of four, lossy data compressor would be operated to combine every four adjacent cells into one value. However, in the preferred embodiment, lossy data compressor can be controlled to either perform lossy data compression or pass the fault data without compression. As in the prior art, a user prepares a test program for the test system which specifies the operation of hardware elements which can be programmed to perform multiple functions.

Data from lossy data compressor 214 is passed to hardware accelerator 216. Hardware accelerator 216 also has multiple modes of operation. It can be programmed to simply pass the data without processing. It can be operated in a "one pass" mode or a "two pass" mode. In one pass mode, hardware accelerator 216 operates on either rows or columns. Hardware accelerator 216 determines whether each row or column contains so many failures that it must be replaced with a redundant element.

Once hardware accelerator 216 determines that a row or column contains so many faulty cells that it must be replaced, it suppresses data on further faulty cells in that row or column, thereby reducing the total amount of data passed on. However, the information which is passed on is sufficient to repair the memory under test. Though the data has been compressed, no useful information is lost.

Hardware accelerator 216 provides the additional benefit of reducing the data analysis time for the fault data. In prior art systems, multiple accesses to analysis DRAM 220 would be necessary to determine which rows or columns must be replaced, taking significant processing time. With the invention, that same processing is performed while the memory is being loaded and takes virtually no extra processing time.

In two pass mode, hardware accelerator 216 performs similarly. However, rather than indicating either rows or columns that must be replaced, it indicates both rows and columns that must be replaced. Two pass mode takes longer than one pass mode in hardware accelerator 216. However, it further reduces the processing time by the redundancy analyzer.

The user is likely to choose one pass or two pass mode based on the total reduction in test time. In an ideal operating state, the amount of time to test a memory under test and load failure data into catch RAM 210 should equal the time it takes for a redundancy analyzer to analyze the data in analysis DRAM 220. In this way, data for one memory under test can be loaded into catch RAM 210 while data in analysis DRAM 220 derived from a previously tested memory is being analyzed by the redundancy analyzer.

Encoder 218 performs further lossless data compression. Its purpose is to reduce the number of bits of data transferred from hardware accelerator 216 into analysis DRAM 220, without losing information on any faulty cells. The encoding scheme works on the principle that faulty cells usually occur in clusters. For example, an impurity introduced into the semiconductor circuitry might cause several adjacent cells to be faulty. Therefore, whenever a faulty cell is encountered, encoder 218 uses to same digital word to identify the faulty cell and to give the status of the adjacent cells. In this way, if any of the adjacent cells is faulty, encoder 218 has eliminated the need to send a separate digital word to identify that cell.

An important advantage of encoding data before loading it into analysis DRAM 220 is that it speeds up the loading process. Analysis DRAM 220 operates at a much slower rate than catch RAM 210. However, encoding multiple pieces of data from catch RAM 210 into one word stored in analysis DRAM 220 allows the transfer to proceed at the fastest rate catch RAM 210 can operate at. For example, if five adjacent cells in catch RAM 210 are represented as one word in analysis DRAM 220, analysis DRAM can be clocked at one fifth the rate of catch RAM 210. Overall speed of the redundancy analysis operation is increased at reduce cost because the data transfer can be performed at the highest rate catch RAM 210 can operate despite the presence of lower speed, less expensive memories used in the redundancy analysis circuitry.

Figure 3:
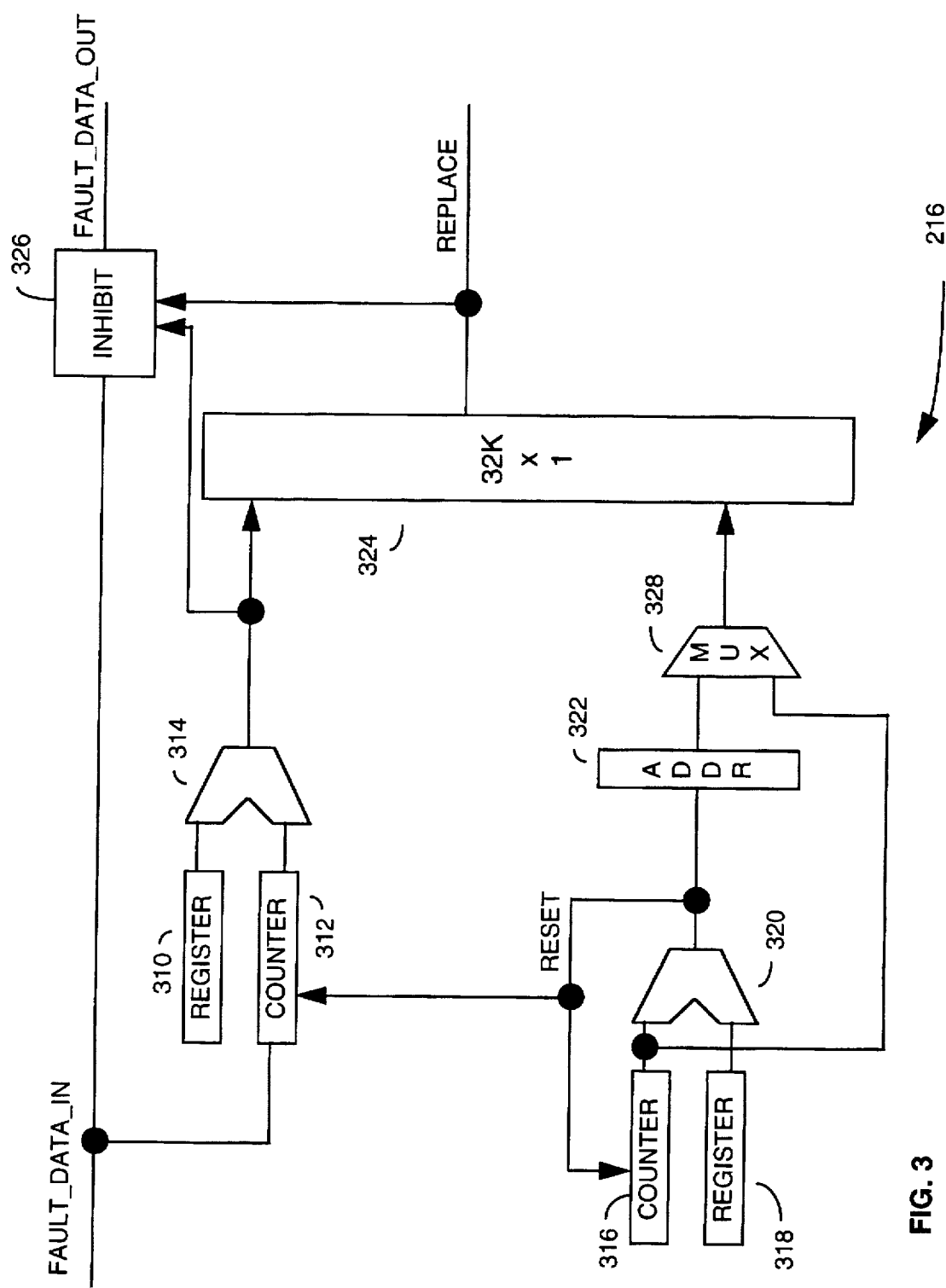
FIG. 3 is a block diagram of the hardware accelerator portion shown in FIG. 2.

Turning now to FIG. 3, additional details of the hardware accelerator 216 are shown. Fault data is provided to hardware accelerator 216 on the FAULT_DATA_IN line. This line is connected to lossy data compressor 214 (FIG. 2). The data on FAULT_DATA_IN comes either one row or one column at a time.

As shown in FIG. 2, catch RAM 210 has an X address counter 224 and a Y address counter 222. Two address counters are used to enable the information in catch RAM 210 to be read out one row or column at a time. To read out a row, X address counter 224 is incremented until the end of the row is reached. To go to the next row, the Y address counter 222 is incremented. To read out a column, Y address counter 222 is incremented until the end of the column is reached. At the end of each column, X address counter 224 is incremented. Thus, control circuitry (not shown) dictates whether a row or column is read out of catch RAM 210 and can provide control signals (not shown) to hardware accelerator 216 to indicate the start or end of a row or column.

FIG. 3 shows that the FAULT_DATA_IN signal is provided to counter 312. Counter 312 increments each time FAULT_DATA_IN takes on a value indicating a faulty cell. If data is read out of catch RAM 210 by rows, counter 312 is reset at the start of each row. If the data is read out by columns, then counter 312 is reset at the start of each column.

Register 310 is loaded with a threshold value that indicates when a row or column must be repaired. For example, if data is being read out by rows and there are four redundant columns in the memory under test, the threshold would be set to five. In other words, if there are five or more faulty cells in one row, that row can not be repaired with the redundant columns. Therefore, if the memory is to be repaired at all, that row must be replaced with a redundant row.

In operation, the threshold value must be programmed by a user, as the correct value depends on the configuration of the memory under test. In a two pass mode of operation, the value in threshold register 310 might be changed between passes to account for different numbers of redundant rows and columns in the memory under test.

The contents of threshold register 310 and faulty cell counter 312 are compared in comparator 314. When the value in faulty cell counter 312 equals or exceeds the value in threshold register 310, the output of comparator 314 is asserted. The output of comparator 314 has different effects, depending on the operating mode.

In one pass mode, the output of comparator 314 runs to an inhibit circuit 326. When the output of comparator 314 is not asserted, inhibit circuit 326 passes FAULT_DATA_IN to FAULT_DATA_OUT. FAULT_DATA_OUT runs to encoder 218 (FIG. 2). In that case, FAULT_DATA_OUT indicates failures at every location that FAULT_DATA_IN indicates a failure.

On the other hand, in one pass mode, when the output of comparator 314 is asserted, inhibit circuit 326 sets FAULT_DATA_OUT to indicate that there are no faulty cells. In other words, the data on any faulty cells is inhibited.

During the first pass of two pass mode operation, the output of comparator 314 is provided as a data input to RAM 324. RAM 324 is a one bit wide memory which contains at least as many storage locations as there are rows or columns in the memory under test. If, during the first pass, comparator 314 indicates that a row or column must be replaced, an indication is stored in memory 324.

Address counter 322 is used to provide an address to memory 324. It is reset at the start of each pass in two pass mode operation. To generate addresses, length register 318 is loaded with the number of cells in either a row or column. When data is being read by rows, the value in register 318 is the length of a row. When data is read by columns, the value is the length of a column.

At the start of each pass, counter 316 is set to zero. As each data value is read from catch RAM 210 (FIG. 2), counter 316 is incremented. When counter 316 is incremented to equal the value in length register 318, the output of comparator 320 is asserted. This signal indicates that the end of row has been reached, when data is read by rows, or that the end of a column is reached, when data is read by columns.

The output of comparator 320 resets counters 312 and 316. This starts over the count of the number of cells in the row or column and likewise starts over the count of faulty cells in that row or column.

In addition, when the output of comparator 320 is asserted, address counter 322 increments. During the first pass, multiplexer 328 is set to provide the value in address counter 322 to memory 324. Address counter 322 accesses the memory location corresponding to the next row or column. If, as indicated by the output of comparator 314, the prior row or column had more faulty cells than the threshold value in register 310, such an indication is left in the appropriate location in memory 324 and is not thereafter changed during that pass. At the end of the first pass, memory 324 contains values which indicate whether each row, when data is read out by rows, or column, when data is read out by columns, must be replaced.

In this way, during the first pass of two pass mode operation, the outputs of comparator 314 are stored in memory 324 rather than controlling inhibit circuit 326. During the first pass of two pass mode operation, inhibit circuit 326 inhibits any data from passing through to FAULT_DATA_OUT. No values are stored in analysis DRAM 222 during the first pass of two pass operation.

During the second pass of two pass mode operation, the way the data is read out is switched. If data was read out by rows during the first pass, it is read out by columns during the second pass and vice versa.

Comparator 314 is again used to indicate whether a column or row, depending on how the data is read out, must be replaced. The output of comparator 314 is provided to inhibit circuit 326. As in one pass mode, if a column or row, as indicated by comparator 314, must be replaced, inhibit circuit 326 inhibits all further data values indicating a faulty cell.

In addition, the values in memory 324 also act to inhibit outputs indicating faulty memory cells. During the second pass, multiplexer 328 is set to connect counter 316 to the address input of memory 324. Counter 316 is incremented for every cell value of FAULT_DATA_IN. In the second pass the memory address is a read address, and a value in memory 324 is read and applied to inhibit circuit 326. If the value read from memory 324 is asserted, it inhibits the passing of data values indicating a faulty cell through inhibit circuit 326. The values read from memory 324 remove faulty cells that are in rows or columns which were determined during the first pass to need replacement.

As an example, if FAULT_DATA_IN is read out of catch RAM 210 by rows in the first pass, the first pass will determine which rows of the memory under test must be replaced if the memory under test is to be repaired. At the end of the first pass, memory 324 stores a logical HI signal for each row that must be replaced. In the illustrated embodiment, no data is passed to analysis DRAM 220 during the first pass.

In the second pass, FAULT_DATA_IN is read out of catch RAM 210 by columns. The failure data is passed through inhibit circuit 326 during the second pass. However, once the output of comparator 314 determines that there are more faulty cells in a column than there are redundant rows, no further indications of faulty cells in that column are passed through inhibit circuit 326. In addition, any faulty cell in a row which must be replaced is also blocked by inhibit circuit 326 based on data read from memory 324.

Inhibit circuit 326 thus passes on only the information needed for further redundancy analysis. Indications of faulty cells which would not alter the redundancy analysis are not passed on, thereby reducing the transfer time as well as the redundancy analysis time. Inhibit circuit 326 is made using standard logic design techniques to perform the functions described above.

Reducing the number of cells indicated as faulty is beneficial because encoder 218 (FIG. 2) provides a digital word to analysis DRAM only when there is a faulty cell. Only a very small percentage of the memory cells in a memory under test are usually faulty, which allows the faulty cells to be described in fewer bits than are in the memory under test. In the prior art, data reduction was achieved by storing just the address of each faulty cell.

Figure 4:
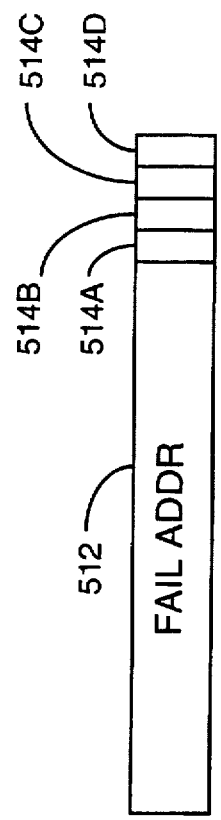
FIG. 4 is a sketch illustrating a compressed data format used in the memory of FIG. 2.

A further enhancement is made in encoder 218 according to the invention. FIG. 4 shows that each digital word out of encoder 218 contains five fields. Field 512 contains the address of a faulty memory cell. Field 512 contains multiple bits to represent the address of any bit in the memory under test. Fields 514A, 514B, 514C an 514D each contain one bit.

Fields 514A, 514B, 514C and 514D each indicate the status of one additional cell in the memory under test. In particular, they indicate the status of the four bits in the memory under test following the faulty bit represented by the address stored in field 512. A logical high in either of fields 514A, 514B, 514C or 514D represents a faulty cell in the corresponding location of the memory under test.

There are several advantages to encoding the information in this fashion. First, faulty cells in a memory under test often occur in groups. Thus, in many instances, when a faulty cell is found, it is likely that at least one of the next four cells will also be faulty. Using four additional bits in each word will often eliminate the need for storing one or more words in analysis DRAM, thereby saving space in analysis DRAM.

A further advantage is that words are loaded into analysis DRAM at a rate that is no faster than one fifth of the rate at which bits are read out of catch RAM 210. This allows analysis DRAM 220 to be clocked at a much slower rate than catch RAM 210. This slower operating rate allows a lower speed and less expensive DRAM to be used.

Once data on the faulty cells in the memory under test is loaded into analysis DRAM 220, it can be processed according to known redundancy analysis techniques. Minor adjustments, well within the skill in the art, need to be made to account for the fact that certain cells in the memory under test are represented as single bits 514A . . . 514D rather than separate words. According to the invention, analysis time is reduced because hardware accelerator 216 has reduced the number of faulty cells in analysis DRAM 220.

The result of this analysis is, in a preferred embodiment, an electronic data file indicating which rows and columns in the memory under test are to be replaced by redundant elements. This electronic data file is passed to a laser repair station, where the memory under test is repaired.

Having described one embodiment, numerous alternative embodiments or variations might be made. For example, FIG. 2 shows that there are three separate analysis DRAM 220, corresponding to different analysis circuits. The actual number of analysis circuits could be different. In a preferred embodiment, there is at least one analysis DRAM for each region in the memory under test. However, there is a cost versus performance tradeoff that which could be made to indicate the total number of analysis circuits.

In the foregoing description, memories have been described as having an address space that starts at 0. Often, in a computerized systems, various memories share one address space so that they can be accessed over a common bus. In that case, the addresses for some of the memories would be offset from zero. However, offsetting the address space of a memory is well known in the art and could be easily used, if desired.

Address offset circuitry might also be required if one analysis circuit is to process information for more than one region. The analysis circuit would sequentially process the cells in one region at a time. In that situation, indexing of addresses to memory 324 would be needed to skip over addresses corresponding to cells outside of the region being processed at the time.

Control mechanisms for all of the hardware elements are not explicitly shown. In a preferred embodiment, a microcontroller is used to generate the appropriate control signals. However, one of skill in the art could devise numerous alternative ways to generate the required control signals for the memory described above.

As an example of other possible variations, it was described that memory 324 is a 32Kx1 bit memory. It might be implemented with a 4Kx8 bit memory with appropriate address decoding.

Also, it should be appreciated that FIG. 2 shows several techniques used together. Lossy data compressor 214 could be omitted entirely. Hardware accelerator 216 could be used alone or in conjunction with encoder 218. Likewise, encoder 218 could be used alone or in conjunction with hardware accelerator 216.

Further, hardware accelerator 216 is not limited to use between a catch RAM and an analysis RAM. It might, for example, be used between the test sub-system and the catch RAM.

Moreover, it was described that analysis DRAM 220 is a slower RAM than catch RAM 210. While there are advantages to being able to use a slower, and therefore less expensive RAM, that is not required. It might in some instances be desirable to use a fast RAM in place of analysis DRAM 220.

As another example of possible variations, FIG. 4 shows four single bit fields 514A . . . 514D for storing information about the memory cells near the faulty cell described by the address in field 512. It is not necessary to obtain the advantages of the invention that there be four such fields or that the fields be single bit fields. For example, only two single bit fields might be used or eight single bit fields could be used. The optimum number will depend on the type of memory being manufactured and the process used for such memory. Processes that result in large clusters of faulty cells will benefit from a higher number of cells. Alternatively, processes that result in many widely distributed faulty cells will benefit from a lower number of cells. Four single bit cells was chosen to be beneficial in a wide range of situations.

Also, it is not necessary that the fields 514A . . . 514D be single bit fields. They could be multi-bit fields. For example, each field might represent an address offset from the faulty cell in field 512. Such a representation would be preferable for a memory manufacturing process that produces memories where faulty cells occur close together, but are usually spaced apart by more than four memory locations.

Further, it was described that hardware accelerator 216 operates in either a one pass mode or a two pass mode. These modes are generated by controlling four separate things: 1) whether inhibit circuit 326 derives its control input from the output of comparator 314 or memory 324; 2) whether the output of comparator 314 is stored in memory 324; 3) whether any data is stored in analysis DRAM 220; and 4) whether inhibit circuit 326 responds to values in memory 324. It will be appreciated that two modes can be generated by appropriately controlling these actions in each pass. However, if a control mechanism is provided to control each of these operations separately, more than two modes of operation can be generated. Therefore, it is not intended the invention be limited to only two modes of operation.

Therefore, the invention should be limited only by the spirit and scope of the appended claims.

What is claimed is:

1. A semiconductor memory manufacturing system of the type which manufactures semiconductor memories having rows and columns of memory cells and redundant rows and columns that can be substituted for rows and columns in the semiconductor memory to replace faulty memory cells, comprising:

a) a test sub-system adapted to determine whether each of the cells in a memory under test is faulty, the test system having a catch memory storing failure indications for the cells in the memory under test;

b) an analysis sub-system adapted to determine which rows and columns of the memory under test should be replaced by redundant rows or columns, the analysis sub-system including an analysis memory; and c) data transfer circuitry connecting the catch memory to the analysis memory, the data transfer circuitry comprising:

i) electronic circuitry for determining, based on the information stored in the catch memory, when a row or column in said semiconductor memory must be replaced and then inhibiting transfer of indications of faulty cells in that row or column; and ii) data encoding circuitry, connected to the electronic circuitry, for passing to the analysis memory indications of the faulty cells not inhibited by the electronic circuitry.

2. The semiconductor memory manufacturing system of claim 1 wherein the indications of the faulty cells produced by the data encoding circuitry comprises an address for at least a portion of the faulty cells.

3. The semiconductor manufacturing system of claim 2 wherein the indications of the faulty cells produced by the data encoding circuitry comprises a plurality of digital words, each word having a multi-bit address field storing the address of a faulty cell and a plurality of fields, each having fewer bits than the multi-bit address field, representing another memory cell based on its location to the memory cell at the address in the multi-bit address field.

4. The semiconductor manufacturing system of claim 3 wherein each of the plurality of fields has a single bit.

5. The semiconductor manufacturing system of claim 4 wherein the plurality of fields comprises four single bit fields.

6. The semiconductor memory manufacturing system of claim 1 wherein the electronic circuitry for determining comprises:

a) a circuit input receiving a stream of data values, each data value in the stream representing a faulty or not faulty state of a cell in the semiconductor memory;

b) a register for storing a threshold value;

c) means for counting representation of faulty cells in the input stream and asserting a control output when the counted number exceeds the threshold value; and d) an inhibit circuit having an input connected to the circuit input and an output, the inhibit circuit substituting data values representing the not faulty state for data values indicating a faulty state when the control output is asserted.

7. The semiconductor memory manufacturing system of claim 1 wherein the electronic circuitry for determining comprises:

a) a circuit input receiving a stream of data values, each data value in the stream representing a faulty or not faulty state of a cell in the semiconductor memory;

a) a transfer circuit memory;

b) address generation circuitry coupled to the transfer circuit memory;

c) means for determining when the number of faulty cells in a row or column of said semiconductor memory exceeds a threshold, d) an inhibit circuit having an input connected to the circuit input and an output, the inhibit circuit further having at least two control inputs, the inhibit circuit substituting data values representing the not faulty state for data values indicating a faulty state when a control input is asserted;

e) a controller to control the electronic circuitry:

i) in a first pass to store in the transfer circuit memory indications from the means from determining of rows or columns that exceed the threshold; and ii) in a second pass to provide values stored in the transfer circuit memory to one control input of the inhibit circuit and the output of the means for determining to a second control input of the inhibit circuit.

8. A semiconductor memory manufacturing system of the type which manufactures semiconductor memories having rows and columns of memory cells and redundant rows and columns that can be substituted for rows and columns in the semiconductor memory to replace faulty memory cells, comprising:

a) a test sub-system adapted to determine whether each of the cells in a memory under test is faulty, the test system having a catch memory storing failure indications for the cells in the memory under test;

b) an analysis sub-system adapted to determine which rows and columns of the memory under test should be replaced by redundant rows or columns, the analysis sub-system including an analysis memory; and c) data transfer circuitry connecting the catch memory to the analysis memory, the data transfer circuitry comprising means for encoding a stream of data values indicating faults in a memory under test, the means for encoding providing an output value having a plurality of fields with at least a first of the plurality of fields indicating the address of a faulty cell in the memory under test and at least a second of the plurality of fields indicating whether there is a fault in the cell at an address having a predetermined relationship to the address in the first of the plurality of fields.

9. The semiconductor memory manufacturing system of claim 8 wherein the second of the plurality of fields is a single bit field.

10. The semiconductor memory manufacturing system of claim 8 wherein the predetermined relationship is that the second of the plurality of fields refers to a cell at the address following the address in the first of the plurality of fields.

11. The semiconductor manufacturing system of claim 8 wherein the plurality of fields in the output values comprises a third, fourth and fifth fields, each indicating whether there is a fault in the cell at an address having a predetermined relationship to the address in the first of the plurality of fields.

12. The semiconductor manufacturing system of claim 8 wherein the catch memory has a first data rate and the analysis memory has a second data rate, the second data rate being slower than the first data rate.

13. The semiconductor memory of claim 12 wherein the catch memory is SRAM and the analysis memory is DRAM.

14. The semiconductor memory of claim 12 wherein the second data rate is less than half that of the first data rate.

15. The semiconductor memory of claim 12 wherein the second data rate is less than one quarter of the first data rate.

16. The semiconductor memory of claim 8 wherein the data transfer circuit additionally comprises electronic circuitry for determining, based on the information stored in the catch memory, when a row or column in said semiconductor memory must be replaced and then inhibiting transfer of indications of faulty cells in that row or column.

17. A semiconductor memory manufacturing system of the type which manufactures semiconductor memories having rows and columns of memory cells and redundant rows and columns that can be substituted for rows and columns in the semiconductor memory to replace faulty memory cells, comprising:

a) a test sub-system adapted to determine whether each of the cells in a memory under test is faulty, the test subsystem generating a stream of data values, each data value indicating whether a cell in a memory under test is faulty;

b) an analysis sub-system, receiving an input data stream having values indicating the locations of faults within a memory under test, to determine which rows and columns of the memory under test should be replaced by redundant rows or columns;

c) data transfer circuitry having an input receiving the stream of data values from the test sub-system and an output providing a data stream to the input of the analysis sub-system, the data transfer circuitry including electronic circuitry for determining, based on the information at its input, when a row or column in said semiconductor memory under test must be replaced and then inhibiting transfer of indications of faulty cells in that row or column.

18. The semiconductor memory manufacturing system of claim 17 wherein the electronic circuitry for determining comprises:

a) a data input, the data at the input taking on at different times, one of a plurality of values with a first of the plurality of values indicating that there is a fault in a cell in the memory under test and a second of the plurality of values indicating that there is no fault in a cell in the memory under test;

b) a data output;

c) inhibit means, having a control input, connected between the data input and the data output for, in response to a signal at the control input:

i) passing the data value from the data input to the data output; or ii) providing at the data output the value indicating that there is not fault in a cell in the memory under test;

d) control means, having a control output coupled to said control input; the means comprising:

i) a first counter configured to count occurrences of data values indicating that there is a fault in a cell in the memory under test, the first counter having a reset input; and ii) a second counter for counting data values at the data input;

iii) means for providing a reset signal to the first counter when the second counter exceeds a predetermined value; and iv) means for generating a control signal when the first counter exceeds a predetermined value.

19. The semiconductor manufacturing system of claim 18 wherein the control means additionally comprises:

a) a memory having a data input and a data output;

b) means for selectively storing the control signal in the memory.

20. The semiconductor memory manufacturing system of claim 19 wherein the control means additionally comprises means for deriving the control input to the inhibit means from the data output of the memory combined with the output of the means for generating a control signal when the first counter exceeds a predetermined value.

* * * * *

UNITED STATES PATENT AND TRADEMARK OFFICE
CERTIFICATE OF CORRRECTION

PATENT NO. : 5,754,556
DATED : May 19, 1998
INVENTOR(S) : Steve G. Ramseyer, et. al.

It is certified that error appears in the above-identified patent and that said Letters Patent is hereby corrected as shown below:

Title page, item [56], insert the following:

FOREIGN PATENT DOCUMENTS

|  |  | DOCUMENT NUMBER |  |  |  |  |  | PUBLICATION DATE | COUNTRY OR PATENT OFFICE | CLASS | SUBCLASS | TRANSLATION YES | NO |
|--|--|--|--|--|--|--|--|--|--|--|--|--|--|
|  |  | DE | 44 | 0 | 2 | 79 | 6 | A1 | August 4 1994 | Germany |  |  |  |  |
|  |  | EP | 0 | 14 | 0 | 59 | 5 | A | May 8 1985 | Europe |  |  |  |  |
|  |  | EP | 0 | 42 | 4 | 61 | 2 | A | May 2 1991 | Europe |  |  |  |  |
|  |  | WO | 8 | 9 | 0 | 21 | 22 | A | March 9 1989 | PCT |  |  |  |  |

OTHER DOCUMENTS

|  |  |
|--|--|
|  | "TECHNIQUE OF USING COMPRESSED BIT-MAP FOR MEMORY UTILIZATION" RESEARCH DISCLOSURE, no. 32412, April 1991, EMSWORTH, GB. |

Signed and Sealed this

Sixth Day of April, 1999

*Attest:*

Q. TODD DICKINSON

*Attesting Officer*  Acting Commissioner of Patents and Trademarks